United States Patent
Berdy et al.

(10) Patent No.: US 9,875,848 B2
(45) Date of Patent: Jan. 23, 2018

(54) MIM CAPACITOR AND METHOD OF MAKING THE SAME

(71) Applicant: QUALCOMM Incorporated, San Diego, CA (US)

(72) Inventors: David Francis Berdy, San Diego, CA (US); Daeik Daniel Kim, Del Mar, CA (US); Niranjan Sunil Mudakatte, San Diego, CA (US); Je-Hsiung Jeffrey Lan, San Diego, CA (US); Chengjie Zuo, Santee, CA (US); Changhan Hobie Yun, San Diego, CA (US); Mario Francisco Velez, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 169 days.

(21) Appl. No.: 14/976,973

(22) Filed: Dec. 21, 2015

(65) Prior Publication Data
US 2017/0178810 A1    Jun. 22, 2017

(51) Int. Cl.
| | |
|---|---|
| *H01G 4/30* | (2006.01) |
| *H01L 23/52* | (2006.01) |
| *H01G 4/01* | (2006.01) |
| *H01G 4/33* | (2006.01) |
| *H01L 23/522* | (2006.01) |
| *H01L 27/08* | (2006.01) |
| *H01L 29/94* | (2006.01) |
| *H01L 49/02* | (2006.01) |

(52) U.S. Cl.
CPC ................ *H01G 4/30* (2013.01); *H01G 4/01* (2013.01); *H01G 4/33* (2013.01); *H01L 23/5223* (2013.01); *H01L 27/0805* (2013.01); *H01L 28/86* (2013.01); *H01L 29/94* (2013.01)

(58) Field of Classification Search
CPC .. H01G 4/30; H01G 4/01; H01G 4/33; H01G 4/03; H01L 23/5223; H01L 27/0805; H01L 28/86; H01L 29/94
See application file for complete search history.

(56) References Cited

U.S. PATENT DOCUMENTS

| 3,514,678 A | 5/1970 | Mark |
| 5,777,839 A | 7/1998 | Sameshima et al. |

(Continued)

FOREIGN PATENT DOCUMENTS

| DE | 19851167 A1 | 5/2000 |
| EP | 1435665 A2 | 7/2004 |

(Continued)

OTHER PUBLICATIONS

International Search Report and Written Opinion—PCT/US2016/064968—ISA/EPO—dated Mar. 17, 2017.

*Primary Examiner* — Dion R Ferguson
(74) *Attorney, Agent, or Firm* — Muncy, Geissler, Olds & Lowe, P.C./QUALCOMM

(57) ABSTRACT

An exemplary MIM capacitor may include a first metal plate, a dielectric layer on the first metal plate, a second metal plate on the dielectric layer, a via layer on the second metal plate, and a third metal plate on the via layer where the second metal plate has a tapered outline with a first side and a second side longer than the first side such that the second side provides a lower resistance path for a current flow.

30 Claims, 6 Drawing Sheets

(56) References Cited

U.S. PATENT DOCUMENTS

| | | | |
|---|---|---|---|
| 6,038,122 A | 3/2000 | Bergstedt et al. | |
| 6,282,079 B1 | 8/2001 | Nagakari et al. | |
| 6,906,907 B2 | 6/2005 | Prymak et al. | |
| 2008/0001256 A1* | 1/2008 | Remmel | H01L 23/5223 |
| | | | 257/533 |
| 2008/0265371 A1* | 10/2008 | Park | H01G 4/33 |
| | | | 257/532 |
| 2012/0307414 A1 | 12/2012 | Kim et al. | |
| 2013/0314838 A1* | 11/2013 | Hwang | H01G 4/385 |
| | | | 361/301.4 |

FOREIGN PATENT DOCUMENTS

| | | |
|---|---|---|
| JP | H1097948 A | 4/1998 |
| JP | 2006128283 A | 5/2006 |
| WO | 9910901 A2 | 3/1999 |
| WO | 03100800 A1 | 12/2003 |

* cited by examiner

MIM CAPACITOR AND METHOD OF MAKING THE SAME

FIELD OF DISCLOSURE

This disclosure relates generally to metal-insulator-metal (MIM) capacitors and more specifically, but not exclusively, to MIM capacitors with tapered capacitor plates.

BACKGROUND

Various capacitive structures are used as electronic elements in integrated circuits such as radio frequency integrated circuits (RFIC), and monolithic microwave integrated circuits (MMIC). Such capacitive structures include, for example, metal-oxide-semiconductor (MOS) capacitors, p-n junction capacitors and metal-insulator-metal (MIM) capacitors. For some applications, MIM capacitors can provide certain advantages over MOS and p-n junction capacitors because the frequency characteristics of MOS and p-n junction capacitors may be restricted as a result of depletion layers that form in the semiconductor electrodes. A MIM capacitor can exhibit improved frequency and temperature characteristics. Furthermore, MIM capacitors are formed in the metal interconnect layers, thereby reducing CMOS transistor process integration interactions or complications.

A MIM capacitor typically includes an insulating layer, such as a PECVD dielectric, disposed between lower and upper electrodes or plates. To reduce the cost, thinner metal plates are highly desirable. Thin metal plates, however, can cause degraded performance. Namely, the MIM capacitor quality factor can be degraded due to current crowding within the thin metal. Typical square or rectangular MIM capacitors exacerbate this problem due to the length that the current has to travel through the thin metal. For example, in a conventional MIM capacitor with a bottom plate (M1), a middle plate (M2) thinner than the bottom plate, and a top plate (M3) thicker than the bottom plate (M1) to ensure dielectric integrity, the bottom plate (M1) surface can become highly irregular if bottom plate (M1) thickness grows too much, causing MIM breakdown voltage to be lower and variation to increase. The bottom plate (M1) has much higher resistance than top plate (M3) causing bottom plate (M1) to become and RF Q-factor bottleneck. Thus, there is a need to reduce the effective bottom plate (M1) resistance through process or design changes to avoid the MIM capacitor quality factor from being degraded due to current crowding within the thin bottom plate (M1). However, these changes are expensive and physically limited.

Accordingly, there is a need for systems, apparatus, and methods that improve upon conventional approaches including the improved methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a metal-insulator-metal capacitor includes: a first metal plate; a first dielectric layer on the first metal plate; a second metal plate on the first dielectric layer, the second metal plate with a tapered outline between a first side and a second side opposite the first side, and the second side being longer than the first side; and a third metal plate on the second metal plate.

In another aspect, a metal-insulator-metal capacitor structure includes: a first capacitor with a tapered outline between a first side and a second side, the second side being longer than the first side; and a second capacitor with a tapered outline between a third side and a fourth side, the third side being longer than the fourth side and proximate to and spaced from the second side, and the second capacitor configured in series with the first capacitor.

In still another aspect, a method for forming a MIM capacitor includes: forming a first metal plate on a substrate; forming a first dielectric layer on the first metal plate; forming a second dielectric layer on the first metal plate; forming a second metal plate on the first dielectric layer; forming a fourth metal plate on the second dielectric layer; forming a third metal plate on the second metal plate; and forming a fifth metal plate on the fourth metal plate.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1A:
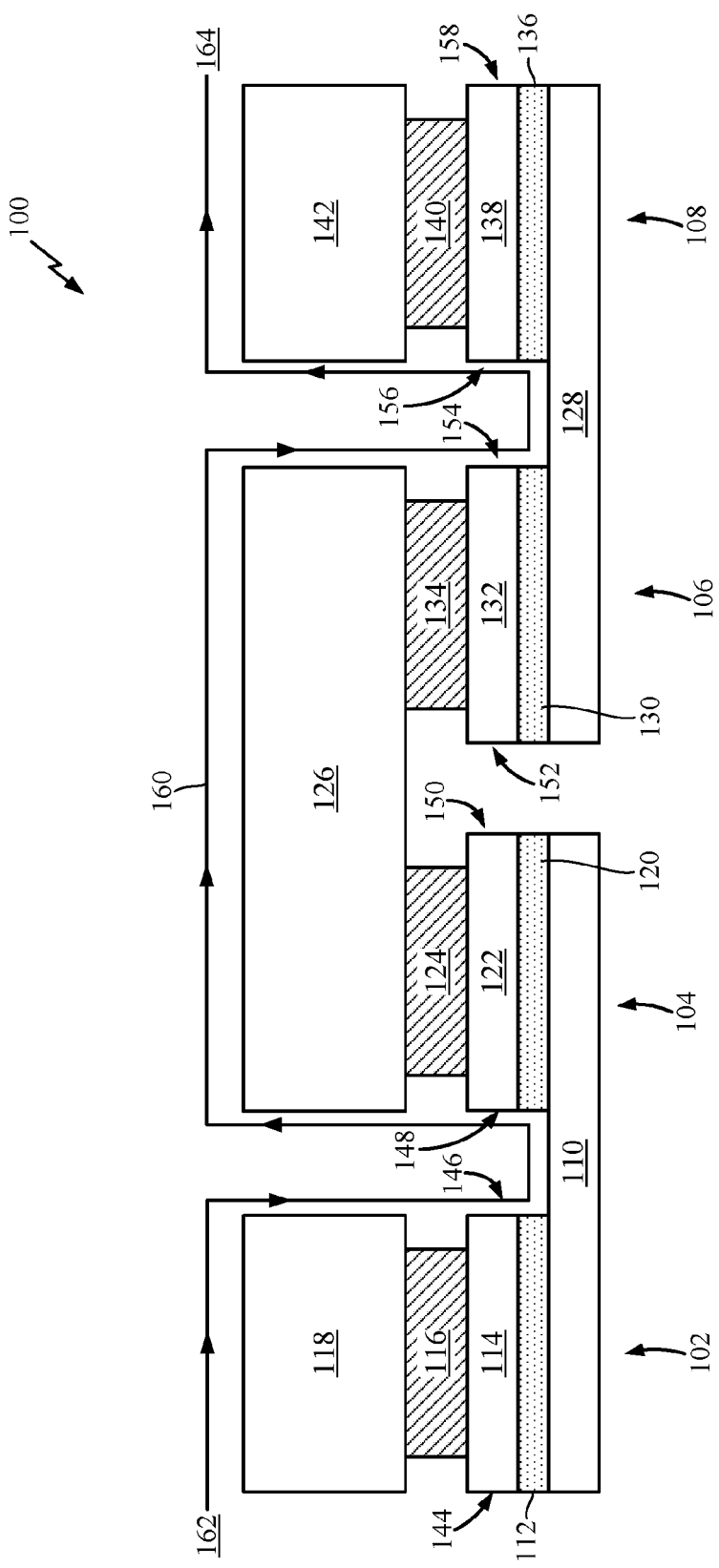
FIGS. 1A and B illustrate a side view and a top view of a MIM capacitor in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For example, a tapered MIM capacitor may include tapered metal plates or electrodes configured such that most of the current travels a shorter length through the thin MIM metal. This reduces losses and increases the capacitor quality factor.

FIGS. 1A and B illustrate a side view and a top view of a MIM capacitor in accordance with some examples of the disclosure. As shown in FIG. 1A, a MIM capacitor 100 may include a first capacitor 102, a second capacitor 104, a third capacitor 106, and a fourth capacitor 108 connected in series. Use of capacitors in series allows an increase in voltage handling capabilities of the MIM capacitor 100. While four capacitors are shown, it should be understood that more or less capacitors may be included in multiples of two (see, for example, FIGS. 2-5 below). Each of the capacitors 102-108 may have a similar configuration with the exception of the top most metal plate between the second capacitor 104 and the third capacitor 106.

For example, the first capacitor 102 may include a first metal plate 110, a first dielectric layer 112 on the first metal plate 110, a second metal plate 114 on the first dielectric layer 112, a first via layer 116 on the second metal plate 114, and a third metal plate 118 on the first via layer 116. The second capacitor 104 may include the first metal plate 110, a second dielectric layer 120 on the first metal plate 110, a fourth metal plate 122 on the second dielectric layer 120, a second via layer 124 on the fourth metal plate 122, and a fifth metal plate 126 on the second via layer 124. The third capacitor 106 may include the sixth metal plate 128, a third dielectric layer 130 on the sixth metal plate 128, a seventh metal plate 132 on the third dielectric layer 130, a third via layer 134 on the seventh metal plate 132, and the fifth metal plate 126 on the third via layer 134. The fourth capacitor 108 may include a sixth metal plate 128, a fourth dielectric layer 136 on the sixth metal plate 128, an eighth metal plate 138 on the fourth dielectric layer 136, a fourth via layer 140 on the eighth metal plate 138, and a ninth metal plate 142 on the fourth via layer 140. The various metal plates may be composed of electrically conductive metal or metal alloys and the dielectric layers may be composed of dielectric materials, such as silicon oxide, silicon nitride, silicon oxy-nitride, or tantalum oxide. The third metal plate 118, the fifth metal plate 126, and the ninth metal plate 142 may be passive devices, such as inductors, transformers, or resistors.

As will be shown and discussed below: the second metal plate 114 may have a tapered outline (e.g. trapezoidal or curved trapezoidal shape from a top down view) that includes a first side 144 and a second side 146 configured such that second side 146 is longer than the first side 144; the fourth metal plate 122 may have a tapered outline (e.g. trapezoidal or curved trapezoidal shape from a top down view) that includes a third side 148 and a fourth side 150 configured such that third side 148 is longer than the fourth side 150; the seventh metal plate 132 may have a tapered outline (e.g. trapezoidal or curved trapezoidal shape from a top down view) that includes a fifth side 152 and a sixth side 154 configured such that sixth side 154 is longer than the fifth side 152; and the eighth metal plate 138 may have a tapered outline (e.g. trapezoidal or curved trapezoidal shape from a top down view) that includes a seventh side 156 and an eighth side 158 configured such that seventh side 156 is longer than the eighth side 158. The longer sides provides a lower resistance path for the current flow through the metal plate that results in the majority of the current flow flowing along the longer side due to the skin effect phenomenon (skin effect is a tendency for alternating current to flow mostly near the outer surface of an electrical conductor, such as a metal plate, and becomes more and more apparent as the frequency increases).

For example, in operation the current flow 160 for the MIM capacitor 100 may travel from an input port 162 through the third metal plate 118 along the second side 146 to the first metal plate 110. Then, from the first metal plate 110 along the third side 148 to the fifth metal plate 126. Then, from the fifth metal plate 126 along the sixth side 154 to the sixth metal plate 128. Then, from the sixth metal plate 128 along the seventh side 156 to the ninth metal plate 142 and then to an output port 164.

Figure 1B:
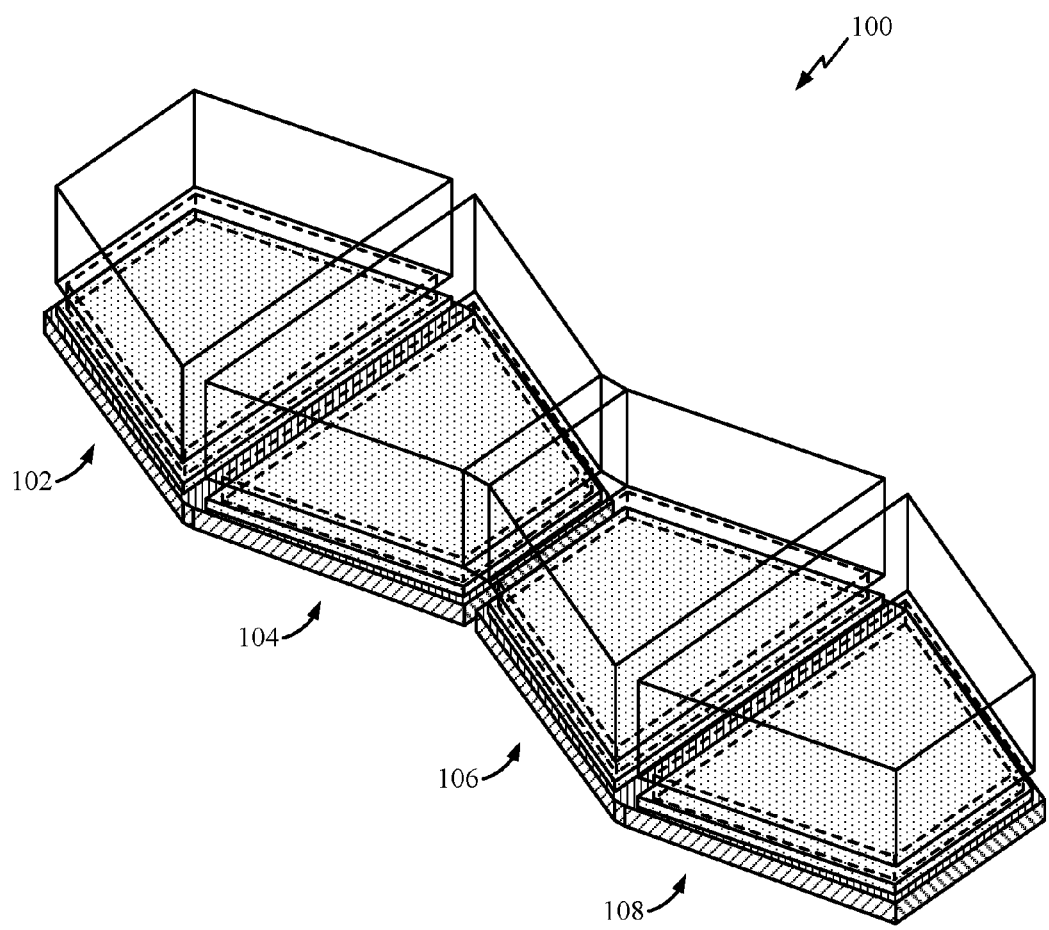

FIG. 1B shows a configuration of the MIM capacitor 100 with all metal plates having a tapered outline. As shown in FIG. 1B, the MIM capacitor 100 may include may include the first capacitor 102, the second capacitor 104, the third capacitor 106, and the fourth capacitor 108 connected in series with each metal plate of the first capacitor 102, the second capacitor 104, the third capacitor 106, and the fourth capacitor 108 having a tapered outline. As shown, the orientation of the tapered outline is the same for the first capacitor 102 and the third capacitor 106 while orientation of the second capacitor 104 and the fourth capacitor 108 is reversed with respect to the first capacitor 102 and the third capacitor 106. By having tapered outlines for all the metal plates in the MIM capacitor 100, the resistance for the current flow 160 shown in FIG. 1A is lower than only a portion of the metal plates having a tapered outline and, correspondingly, the quality factor of the MIM capacitor 100 is increased as well. Alternatively, the top two metal plates in each capacitor (e.g. the second metal plate 114 and the third metal plate 118) may have the tapered outline and the bottom most plate (e.g. the first metal plate 110) may be square. In such a configuration, the lower resistance and higher quality factor will be similar in that the skin effect does not impact the first metal plate 110 or the sixth metal plate 128.

Figure 2A:
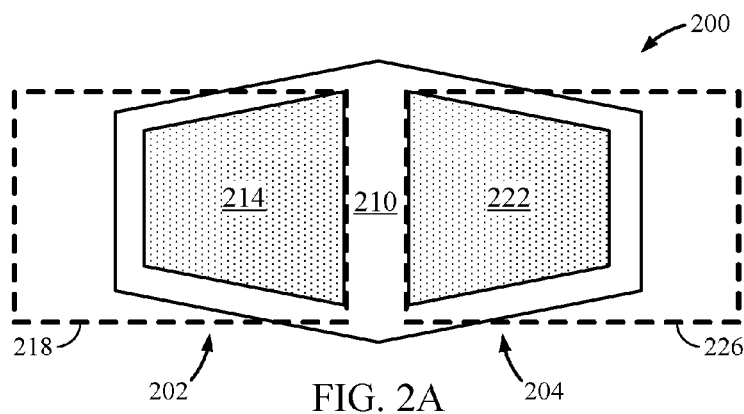
FIGS. 2A-D illustrate various configurations of tapered plates for a MIM capacitor in accordance with some examples of the disclosure.

FIGS. 2A-D illustrate various configurations of tapered plates for a MIM capacitor in accordance with some examples of the disclosure. As shown in FIG. 2A, a MIM capacitor 200 may include a first capacitor 202 in series with a second capacitor 204. The first capacitor 202 may include a first metal plate 210 with a tapered outline, a second metal plate 214 with a tapered outline above the first metal plate 210, and a third metal plate 218 with a rectangular outline above the second metal plate 214. The second capacitor 204 may include the first metal plate 210 with a tapered outline, a fourth metal plate 222 with a tapered outline above the first metal plate 210, and a fifth metal plate 226 with a rectangular outline above the fourth metal plate 222.

Figure 2B:
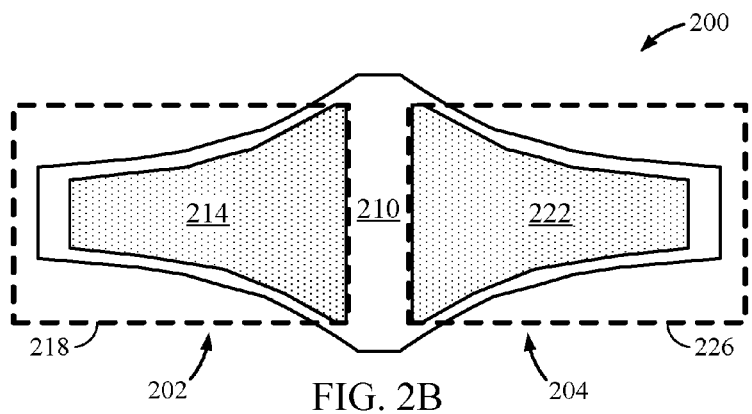

FIG. 2B shows an alternative configuration. As shown in FIG. 2B, a MIM capacitor 200 may include a first capacitor 202 in series with a second capacitor 204. The first capacitor 202 may include a first metal plate 210 with a curved tapered outline, a second metal plate 214 with a curved tapered outline above the first metal plate 210, and a third metal plate 218 with a rectangular outline above the second metal plate 214. The second capacitor 204 may include the first metal plate 210 with a curved tapered outline, a fourth metal plate 222 with a curved tapered outline above the first metal plate 210, and a fifth metal plate 226 with a rectangular outline above the fourth metal plate 222.

Figure 2C:
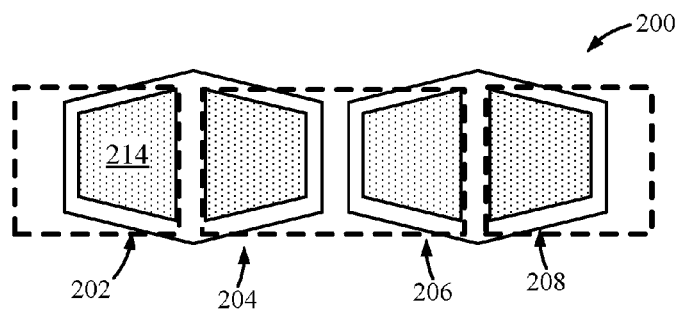

FIG. 2C shows another alternative configuration. As shown in FIG. 2C, a MIM capacitor 200 may include a first capacitor 202 in series with a second capacitor 204, a third capacitor 206, and a fourth capacitor 208. The first capacitor 202 and the second capacitor 204 may be similar to that described with respect to FIG. 2A while the third capacitor 206 and the fourth capacitor 208 may be similar to the first capacitor 202 and the second capacitor 204, respectively.

Figure 2D:
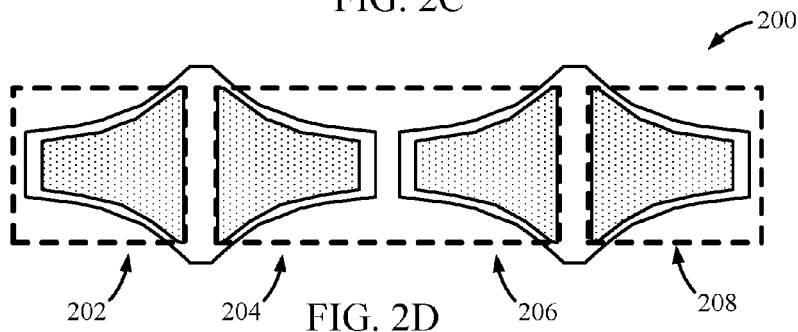

FIG. 2D shows still another alternative configuration. As shown in FIG. 2D, a MIM capacitor 200 may include a first capacitor 202 in series with a second capacitor 204, a third capacitor 206, and a fourth capacitor 208. The first capacitor 202 and the second capacitor 204 may be similar to that described with respect to FIG. 2B while the third capacitor 206 and the fourth capacitor 208 may be similar to the first capacitor 202 and the second capacitor 204, respectively. The symmetrical configurations shown in FIGS. 2A-D allow the use of the same process for manufacturing each capacitor and cancel second order harmonics in the MIM capacitor 200.

Figure 3A:
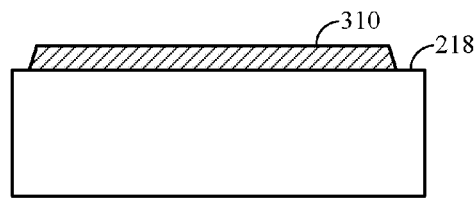
FIGS. 3A-E illustrate a partial process flow for manufacturing a MIM capacitor in accordance with some examples of the disclosure.
Figure 3B:
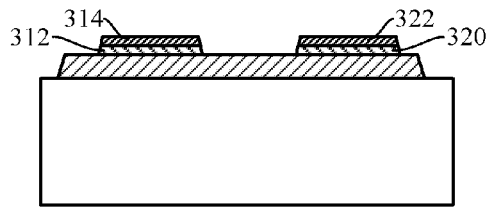
Figure 3C:
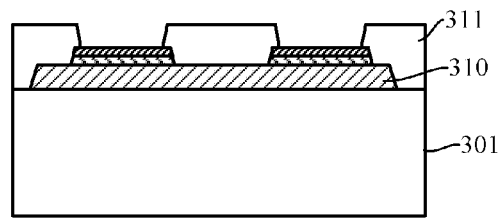
Figure 3D:
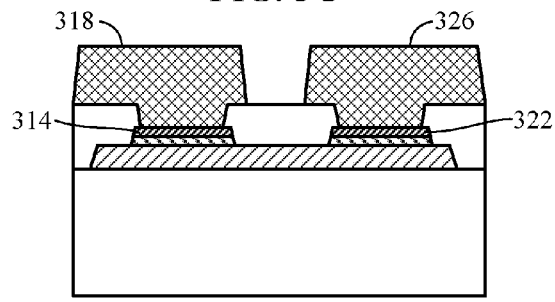
Figure 3E:
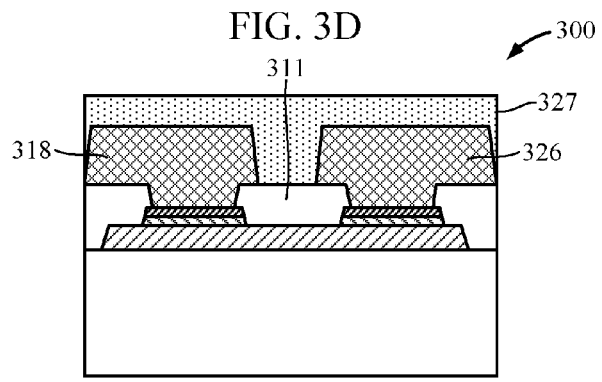

FIGS. 3A-E illustrate a partial process flow for manufacturing a MIM capacitor in accordance with some examples of the disclosure. As shown in FIG. 3A, the partial process for manufacturing a MIM capacitor 300 begins with providing a substrate 301 and forming a first metal plate 310 (e.g. the first metal plate 110 and the first metal plate 210), such as by depositing and patterning suitable material on the substrate 301. The process continues in FIG. 3B with formation of a first dielectric layer 312 (e.g. the a first dielectric layer 112) and a second dielectric layer 320 (e.g. the second dielectric layer 120) on the first metal plate 310 followed by and formation of a second metal plate 314 (e.g. the second metal plate 114 and the second metal plate 214) on the first dielectric layer 312 and a fourth metal plate 322 (e.g., the fourth metal plate 122 and the fourth metal plate 222) on the second dielectric layer 320, such as by depositing and patterning suitable material. The process continues in FIG. 3C with formation of an interlayer dielectric 311 on exposed portions of the first metal plate 310 and the substrate 301, such as by depositing and patterning suitable material. The process continues in FIG. 3D with formation of a third metal plate 318 (e.g. the third metal plate 118 and the third metal plate 218) on the second metal plate 314 and a fifth metal plate 326 (e.g. the fifth metal plate 126 and the fifth metal plate 226) on the fourth metal plate 322, such as by depositing and patterning suitable material. The partial process concludes in FIG. 3E with the formation of a passivation layer 327 on the third metal plate 318, the interlayer dielectric 311, and the fifth metal plate 326, such as by depositing and patterning suitable material. The first metal plate may have a thickness of approximately 2-3 μm, the second metal plate 314 and the fourth metal plate 322 each may have a thickness of approximately 1 μm, and the third metal plate 318 and the fifth metal plate 326 each may have a thickness of approximately 10-20 μm. While only two capacitors are shown in FIGS. 3A-E, it should be understood that more than two capacitors may be formed using the partial process described above.

Figure 4A:
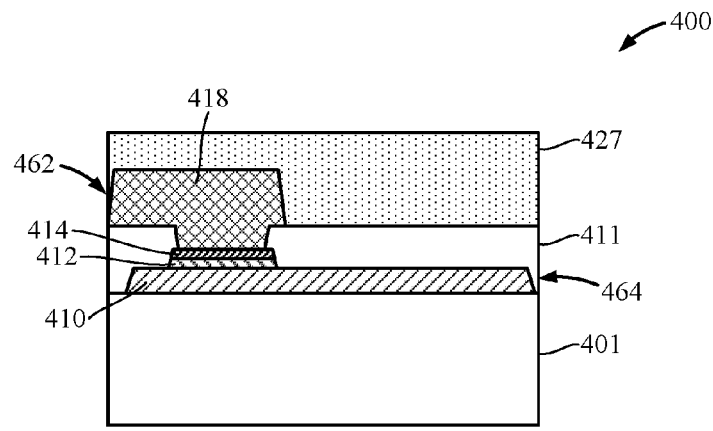
FIGS. 4A-C illustrate side views of various single and series configurations of a MIM capacitor in accordance with some examples of the disclosure.
Figure 4B:
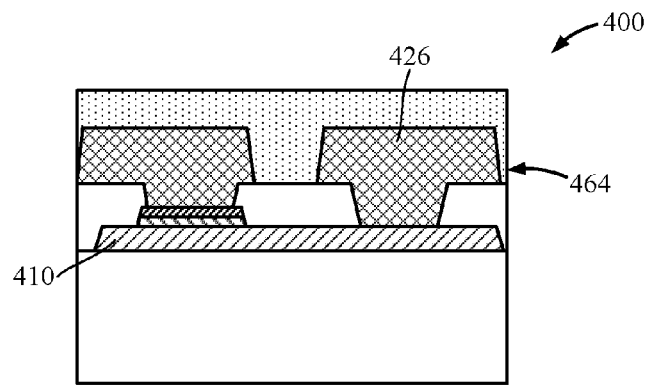
Figure 4C:
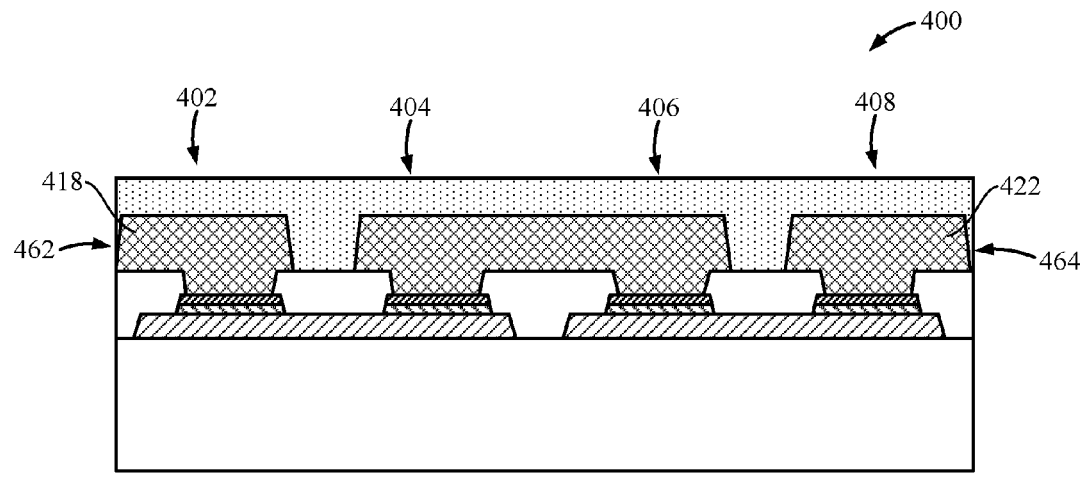

FIGS. 4A-C illustrate side views of various single and series configurations of a MIM capacitor in accordance with some examples of the disclosure. As shown in FIG. 4A, a MIM capacitor 400 with a single capacitor may include a first metal plate 410 on the substrate 401, a first dielectric layer 412 on the first metal plate 410, a second metal plate 414 on the first dielectric layer 412, an interlayer dielectric 411 on portions of the first metal plate 410 and the substrate 301, a third metal plate 418 on the second metal plate 414, a passivation layer 427 on the third metal plate 418 and the interlayer dielectric 411, a input port 462 coupled to the third metal plate 418, and an output port 464 coupled to the first metal plate 410. As shown in FIG. 4B, a MIM capacitor 400 with a single capacitor may include the same components as shown in FIG. 4A with a fifth metal plate 426 on the first metal plate 410 and the output port 464 coupled to the fifth metal plate 426 instead of the first metal plate 410. As shown in FIG. 4C, a MIM capacitor 400 with a first capacitor 402, a second capacitor 404, a third capacitor 406, and a fourth capacitor 408 in series, and an input port 462 coupled to a third metal plate 418 of the first capacitor 402 along with an output port 464 coupled to a ninth metal plate 442 of the fourth capacitor 408 connected in series similar to that shown in FIG. 1A.

Figure 5:
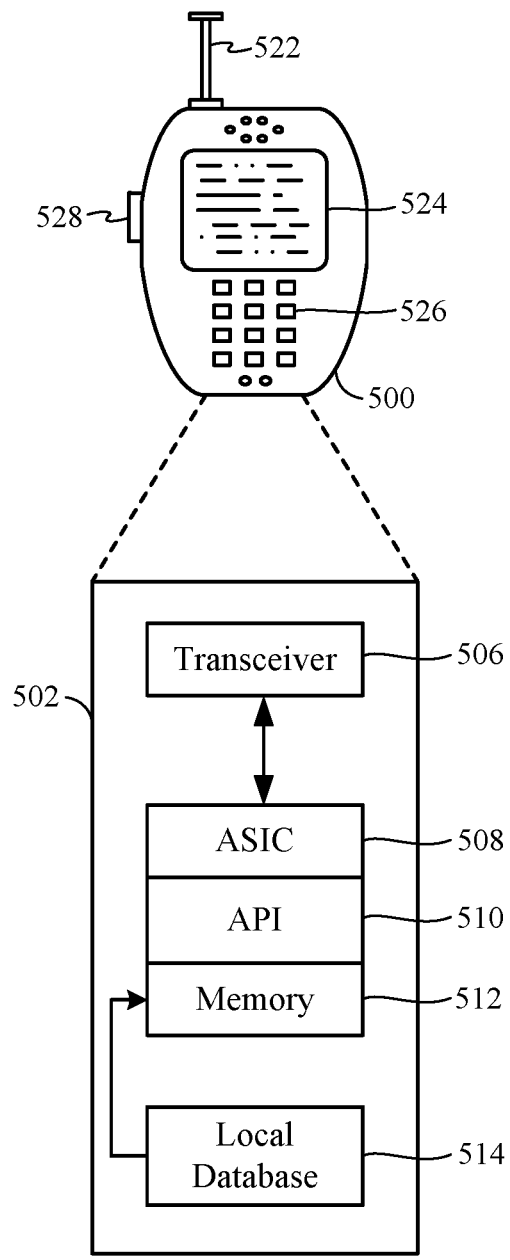
FIG. 5 illustrates exemplary user equipment (UE) in accordance with some examples of the disclosure.

MIM capacitor devices according to the examples above (e.g. any of MIM capacitor 100, MIM capacitor 200, MIM capacitor 300, and MIM capacitor 400) can be used for a number of different applications, such as in the circuit components of a mobile device. Referring to FIG. 5 as an example, an UE 500, (here a wireless device), which has a platform 502 that can receive and execute software applications, data and/or commands transmitted from a radio access network (RAN) that may ultimately come from a core network, the Internet and/or other remote servers and networks. Platform 502 can include transceiver 506 operably coupled to an application specific integrated circuit ("ASIC" 508), or other processor, microprocessor, logic circuit, or other data processing device. ASIC 508 or other processor executes the application programming interface ("API") 510 layer that interfaces with any resident programs in memory 512 of the wireless device. Memory 512 can be comprised of read-only or random-access memory (RAM and ROM), EEPROM, flash cards, or any memory common to computer platforms. Platform 502 also can include local database 514 that can hold applications not actively used in memory 512. Local database 514 is typically a flash memory cell, but can be any secondary storage device as known in the art, such as magnetic media, EEPROM, optical media, tape, soft or hard disk, or the like. Internal platform 502 components can also be operably coupled to external devices such as antenna 522, display 524, push-to-talk button 528 and keypad 526 among other components, as is known in the art.

The wireless communication between UE 500 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A metal-insulator-metal capacitor comprising:
    a first metal plate;
    a first dielectric layer on the first metal plate;
    a second metal plate on the first dielectric layer, the second metal plate with a tapered outline between a first side and a second side opposite the first side, and the second side being longer than the first side; and
    a third metal plate on the second metal plate.

2. The metal-insulator-metal capacitor of claim 1, wherein the second metal plate has a trapezoidal outline.

3. The metal-insulator-metal capacitor of claim 1, wherein the first metal plate and the second metal plate have a trapezoidal outline.

4. The metal-insulator-metal capacitor of claim 1, wherein the second metal plate has a curved trapezoidal outline.

5. The metal-insulator-metal capacitor of claim 1, wherein the first metal plate and the second metal plate have a curved trapezoidal outline.

6. The metal-insulator-metal capacitor of claim 1, wherein the first metal plate, the second metal plate, and the first dielectric layer form a capacitor, and the third metal plate comprises a passive device.

7. The metal-insulator-metal capacitor of claim 1, wherein the first metal plate has a thickness of approximately 2-3 $\mu$m, the second metal plate has a thickness of approximately 1 $\mu$m, and the third metal plate has a thickness of approximately 10-20 $\mu$m.

8. The metal-insulator-metal capacitor of claim 1, wherein the metal-insulator-metal capacitor is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

9. The metal-insulator-metal capacitor of claim 1, further comprising:
    an input port configured for a first external connection and coupled to the third metal plate; and
    an output port configured for a second external connection and coupled to first metal plate.

10. The metal-insulator-metal capacitor of claim 1, further comprising:
- a fifth metal plate on the first metal plate proximate to and spaced from the third metal plate;
- an input port configured for a first external connection and coupled to the third metal plate; and
- an output port configured for a second external connection and coupled to fifth metal plate.

11. The metal-insulator-metal capacitor of claim 1, further comprising:
- a second dielectric layer on the first metal plate proximate to and spaced from the first dielectric layer;
- a fourth metal plate on the second dielectric layer, the fourth metal plate with a tapered outline between a third side and a fourth side opposite the first side, and the third side being longer than the fourth side; and
- a fifth metal plate on the fourth metal plate.

12. The metal-insulator-metal capacitor of claim 11, wherein the second metal plate and the fourth metal plate have a trapezoidal outline.

13. The metal-insulator-metal capacitor of claim 11, wherein the first metal plate, the second metal plate, and the fourth metal plate have a trapezoidal outline.

14. The metal-insulator-metal capacitor of claim 11, wherein the second metal plate and the fourth metal plate have a curved trapezoidal outline.

15. The metal-insulator-metal capacitor of claim 11, wherein the first metal plate, the second metal plate, and the fourth metal plate have a curved trapezoidal outline.

16. The metal-insulator-metal capacitor of claim 11, wherein the first metal plate, the second metal plate, and the first dielectric layer form a first capacitor; the third metal plate comprises a passive device; the first metal plate, the fourth metal plate, and the second dielectric layer form a second capacitor; and the fifth metal plate comprises a passive device.

17. The metal-insulator-metal capacitor of claim 11, wherein the first metal plate has a thickness of approximately 2-3 µm, the second metal plate and the fourth metal plate each have a thickness of approximately 1 µm, and the third metal plate and the fifth metal plate each have a thickness of approximately 10-20 µm.

18. The metal-insulator-metal capacitor of claim 11, wherein the metal-insulator-metal capacitor is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

19. The metal-insulator-metal capacitor of claim 11, further comprising:
- an input port configured for a first external connection and coupled to the third metal plate; and
- an output port configured for a second external connection and coupled to fifth metal plate.

20. The metal-insulator-metal capacitor of claim 11, further comprising:
- a sixth metal plate;
- a third dielectric layer on the sixth metal plate;
- a seventh metal plate on the third dielectric layer, the seventh metal plate with a tapered outline between a fifth side and a sixth side opposite the fifth side, and the sixth side being longer than the fifth side and the fifth metal plate extending on to the seventh metal plate;
- a fourth dielectric layer on the sixth metal plate;
- an eighth metal plate on the fourth dielectric layer, the eighth metal plate with a tapered outline between a seventh side and an eighth side opposite the seventh side, and the seventh side being longer than the eighth side; and
- a ninth metal plate on the eighth metal plate.

21. The metal-insulator-metal capacitor of claim 20, wherein the second metal plate, the fourth metal plate, the seventh metal plate, and the eighth metal plate have a trapezoidal outline.

22. The metal-insulator-metal capacitor of claim 20, wherein the first metal plate, the second metal plate, the fourth metal plate, the sixth metal plate, the seventh metal plate, and the eighth metal plate have a trapezoidal outline.

23. The metal-insulator-metal capacitor of claim 20, wherein the second metal plate, the fourth metal plate, the seventh metal plate, and the eighth metal plate have a curved trapezoidal outline.

24. The metal-insulator-metal capacitor of claim 20, wherein the first metal plate, the second metal plate, the fourth metal plate, the sixth metal plate, the seventh metal plate, and the eighth metal plate have a curved trapezoidal outline.

25. The metal-insulator-metal capacitor of claim 20, wherein the first metal plate, the second metal plate, and the first dielectric layer form a first capacitor; the third metal plate comprises a passive device; the first metal plate, the fourth metal plate, and the second dielectric layer form a second capacitor; the fifth metal plate comprises a passive device; the sixth metal plate, the third dielectric layer, and the seventh metal plate form a third capacitor; the sixth metal plate, the fourth dielectric layer, and the eighth metal plate form a fourth capacitor; and the ninth metal plate comprises a passive device.

26. The metal-insulator-metal capacitor of claim 20, further comprising:
- an input port configured for a first external connection and coupled to the third metal plate; and
- an output port configured for a second external connection and coupled to the ninth metal plate.

27. A metal-insulator-metal capacitor structure comprising:
- a first capacitor with a tapered outline between a first side and a second side, the second side being longer than the first side; and
- a second capacitor with a tapered outline between a third side and a fourth side, the third side being longer than the fourth side and proximate to and spaced from the second side, and the second capacitor configured in series with the first capacitor.

28. The metal-insulator-metal capacitor structure of claim 27, further comprising:
- a third capacitor with a tapered outline between a fifth side and a sixth side, the sixth side being longer than the fifth side;
- a fourth capacitor with a tapered outline between a seventh side and a eighth side, the seventh side being longer than the eighth side and proximate to and spaced from the sixth side; and
- the first capacitor, the second capacitor, the third capacitor, and the fourth capacitor configured in series.

29. A method for forming a metal-insulator-metal capacitor, the method comprising:
- forming a first metal plate on a substrate;
- forming a first dielectric layer on the first metal plate;
- forming a second dielectric layer on the first metal plate;

forming a second metal plate on the first dielectric layer, the second metal plate having a tapered outline between a first side and a second side opposite the first side, and the second side being longer than the first side;

forming a fourth metal plate on the second dielectric layer, the fourth metal plate having a tapered outline between a third side and a fourth side opposite the first side, and the fourth side being longer than the third side;

forming a third metal plate on the second metal plate; and forming a fifth metal plate on the fourth metal plate.

30. The method of claim 29, further comprising:

forming an interlayer dielectric on a portion of the first metal plate and the substrate; and forming a passivation layer on the third metal plate, the interlayer dielectric, and the fifth metal plate.

* * * * *